(12) United States Patent
Chen et al.

(10) Patent No.: US 11,695,396 B2
(45) Date of Patent: Jul. 4, 2023

(54) CIRCUIT AND METHOD FOR GENERATING ULTRAHIGH-PRECISION DIGITAL PULSE SIGNALS

(71) Applicant: HUNAN GREAT-LEO MICROELECTRONICS CO., LTD., Hunan (CN)

(72) Inventors: Hu Chen, Hunan (CN); Ye Xu, Hunan (CN); Jianghua Wan, Hunan (CN)

(73) Assignee: HUNAN GREAT-LEO MICROELECTRONICS CO., LTD., Hunan (CN)

( * ) Notice: Subject to any disclaimer, the term of this patent is extended or adjusted under 35 U.S.C. 154(b) by 0 days.

(21) Appl. No.: 17/617,006

(22) PCT Filed: Jan. 29, 2021

(86) PCT No.: PCT/CN2021/074318
§ 371 (c)(1),
(2) Date: Dec. 7, 2021

(87) PCT Pub. No.: WO2021/179836
PCT Pub. Date: Sep. 16, 2021

(65) Prior Publication Data
US 2022/0173727 A1 Jun. 2, 2022

(30) Foreign Application Priority Data
Mar. 12, 2020 (CN) .......................... 202010168931.8

(51) Int. Cl.
*H03K 4/02* (2006.01)
*H03K 7/08* (2006.01)
*H03K 21/40* (2006.01)

(52) U.S. Cl.
CPC .............. *H03K 4/026* (2013.01); *H03K 7/08* (2013.01); *H03K 21/406* (2013.01)

(58) Field of Classification Search
CPC .......... H03K 4/026; H03K 7/08; H03K 21/40; H03K 21/406
(Continued)

(56) References Cited

U.S. PATENT DOCUMENTS

| 6,759,885 | B2 | 7/2004 | Chen | |
| 2005/0229056 | A1* | 10/2005 | Rohrbaugh | .... G01R 31/318566 |
| | | | | 714/726 |
| 2011/0234271 | A1 | 9/2011 | Kushnick | |

FOREIGN PATENT DOCUMENTS

| CN | 104135256 | 11/2014 |
| CN | 105656456 | 6/2016 |

(Continued)

OTHER PUBLICATIONS

Bupesh Pandita, "Delay Calibration Circuit for Delay Lines", 2015 IEEE International Symposium on Circuits and Systems (ISCAS), Jul. 2015, pp. 850-853.

(Continued)

*Primary Examiner* — William Hernandez
(74) *Attorney, Agent, or Firm* — JCIP Global Inc.

(57) ABSTRACT

A circuit, for generating ultrahigh-precision digital pulse signals comprises: a pulse edge control circuit used for delaying a signal on an input pin and accurately controlling positions of a rising edge and a falling edge of the pulse signal to accurately control the width of pulses and generate ultrahigh-precision pulses; a static calibration circuit used for calculating step size information representing the relationship between a work clock period of a system and a delay of delay cells in the pulse edge control circuit when the system is powered on to work, and storing the step size information, wherein the step size information is the number of delay cells through which the signal is propagated and passes within one system clock period; and a dynamic calibration circuit used for dynamically calculating step size (Continued)

information when a rising edge or a falling edge of each pulse in the input pin arrives.

20 Claims, 5 Drawing Sheets

(58) Field of Classification Search
USPC .......................................................... 327/172
See application file for complete search history.

(56) References Cited

FOREIGN PATENT DOCUMENTS

| | | |
|---|---|---|
| CN | 106612111 | 5/2017 |
| CN | 111327298 | 6/2020 |

OTHER PUBLICATIONS

Li Liujie, "Design of data acquisition and high-precision pulse generation system based on FPGA", Electronic Technology & Information Science, China Master's Theses Full-text Database, Feb. 2020, submit with English abstract, pp. 1-96.
"International Search Report (Form PCT/ISA/210) of PCT/CN2021/074318," dated May 6, 2021, pp. 1-4.
"Written Opinion of the International Searching Authority (Form PCT/ISA/237) of PCT/CN2021/074318," dated May 6, 2021, pp. 1-6.

* cited by examiner

CIRCUIT AND METHOD FOR GENERATING ULTRAHIGH-PRECISION DIGITAL PULSE SIGNALS

CROSS-REFERENCE TO RELATED APPLICATION

This application is a 371 of international application of PCT application serial no. PCT/CN2021/074318, filed on Jan. 29, 2021, which claims the priority benefits of China Patent Application No. 202010168931.8, filed on Mar. 12, 2020. The entirety of each of the above mentioned patent applications is hereby incorporated by reference herein and made a part of this specification.

BACKGROUND OF THE INVENTION

Technical Field

The invention mainly relates to the technical field of digital signal processors, and more specifically, to a circuit and method for generating ultrahigh-precision digital pulse signals.

Description of Related Art

PWM (Pulse Width Modulation) is a method for controlling analog signal levels by means of digital outputs, and mathematically functions as a digital-to-analog converter. The PWM technique is one of the core technologies of frequency conversion, and has been widely applied to the fields of measurement, communication, and power/speed control and conversion of power supplies/motors. Typical applications of the PWM technique include: power conversion of power grids, variable-frequency air conditioners, switching (digital) power supplies, servo control of robot motors, smart electric meters, and the like.

Figure 1:
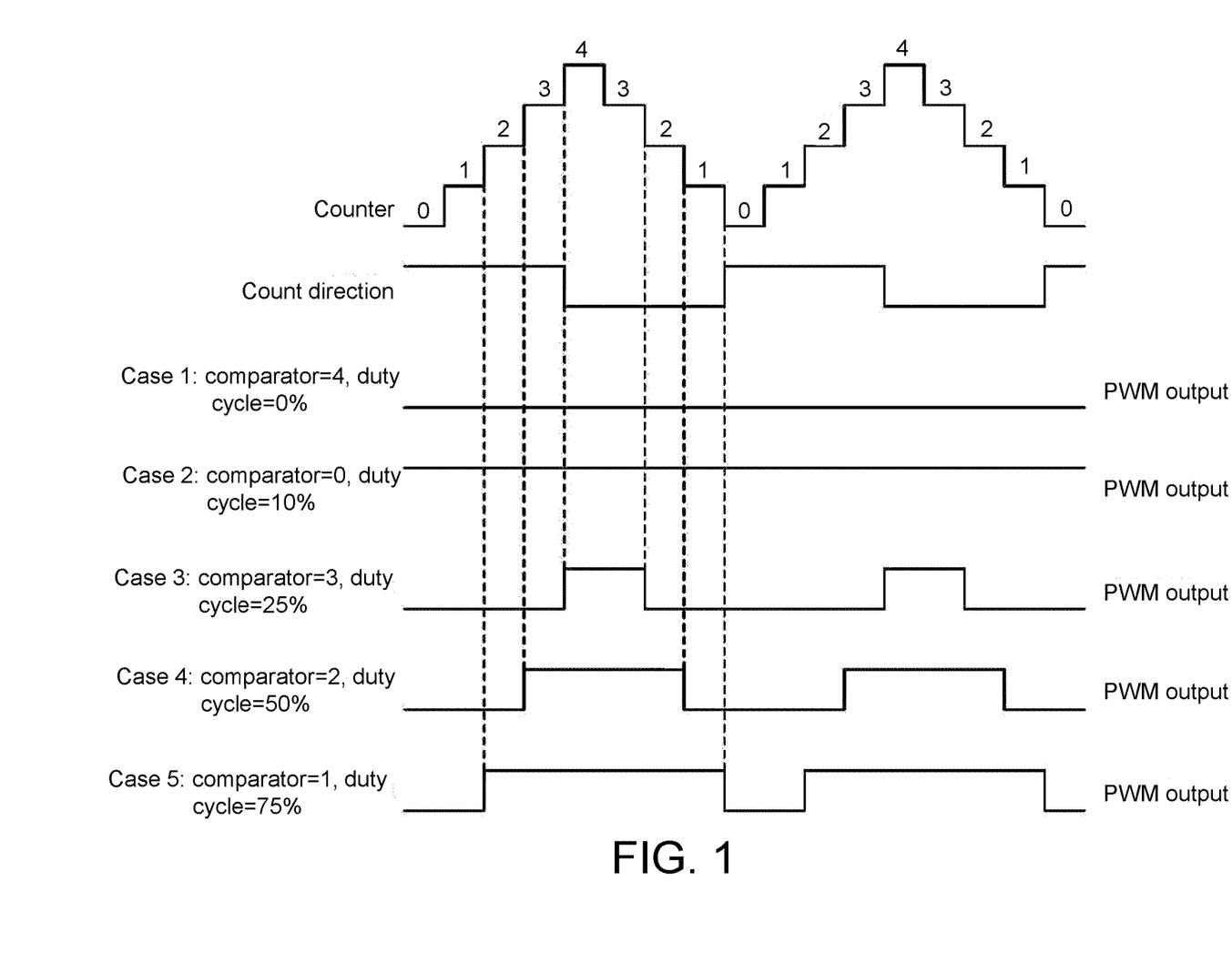
FIG. 1 is a schematic diagram of common symmetric and periodic PWM waveforms.

Generally, a PWM circuit used for modulating the width of pulse signals in digital signal processors (DSPs) and other integrated circuits comprises two typical parts: (1) a synchronous digital counter used to generate a counter value; and (2) a digital comparator used to compare the counter value to programmable thresholds. When the counter value reaches a first programmable threshold, a pulse signal (such as a voltage or current signal) is generated; and when the counter value reaches a second programmable threshold, the pulse signal is turned off. So, the width of the pulse signal can be modulated by the counter and the comparator. FIG. 1 illustrates several typical PWM waveforms.

Because the counter works in a system clock domain, the time precision of pulses generated by traditional PWM circuits is limited by the system clock period $T_{sys}$. For example, when the system clock frequency of a circuit is 100 MHz, the pulse precision is 10 ns. However, the pulse precision is required to reach 150 ps or even lower in high-precision application scenarios such as high-precision motor control, switching power supply control, uninterrupted power supplies (UPSs), and other applications needing digital-to-analog conversion or a PWM function. To enable the pulse precision to reach 150 ps, the system clock frequency of the traditional PWM circuits has to reach at least 6.7 GHz, which is almost impossible due to the limitation of the process, power consumption, and cost of integrated circuits.

A delay chain is generally used to realize high-precision pulses without increasing the system clock frequency. That is, multiple specific circuit units (delay cells) capable of delaying signals to a certain extent (such as by 150 ps) are cascaded in series to form the delay chain, and the width of pulse signals is accurately controlled by controlling the path of the signals on the delay chain (the number of delay cells, through which the signals pass). Because the delay δ of the delay cells varies with factors such as the working voltage, temperature, and integrated circuit fabrication process of circuits, the relationship between the system clock period and the delay δ of the delay cells (step size Step_Size) needs to be calculated or calibrated continuously during the working process of the circuits to further accurately calculate the parameters or offsets of control signals on the path of the delay chain. The relationship between $T_{sys}$ and δ is as follows:

$$\text{Step\_Size} = T_{sys}/\delta \quad (1)$$

At present, only TI and ADI in the US fulfill ultrahigh-precision PWM pulses with the time precision reaching 150 ps without increasing the system clock frequency. TI in the US adopts a time precision calibration method purely depending on software, and a user program has to periodically execute a calibration procedure to calculate the step size Step_Size. This calibration procedure not only consumes hardware resources and system execution time, but also has to perform calibration in a fixed mode and period and cannot timely reflect changes of the time precision. ADI adopts a calibration mechanism purely depending on hardware; however, extra delay cells have to be added on the basis of the delay chain to shift the edge to realize calibration, which not only increases the complexity of the physical design of circuits, but also affects the calibrated time precision because the added delay cells will be influenced by factors such as the voltage, temperature, and process.

BRIEF SUMMARY OF THE INVENTION

The technical issue to be settled by the invention is to solve the technical problems of the prior art by providing a circuit and method for generating ultrahigh-precision digital pulse signals, which are simple in structure, easy to implement, high in precision, and suitable for a wide pulse frequency range.

To settle the aforesaid technical issue, the invention adopts the following technical solution:

A circuit for generating ultrahigh-precision digital pulse signals comprises:

A pulse edge control circuit used for delaying a signal on an input pin Input and accurately controlling the positions of a rising edge and a falling edge of the pulse signal to accurately control the width of pulses and generate ultrahigh-precision pulses;

A static calibration circuit used for calculating step size information representing the relationship between a work clock period of a system and a delay of delay cells in the pulse edge control circuit when the system is powered on to work, and storing the step size information, wherein the step size information is the number of delay cells, through which the signal is propagated and passes within one system clock period; and A dynamic calibration circuit used for dynamically and real-time calculating step size information when a rising edge or a falling edge of each pulse on the input pin Input arrives.

As a further improvement of the circuit of the invention: the pulse edge control circuit comprises a delay chain, a delay control circuit, and a delay compensation circuit; the delay chain consists of a series of delay cells DLL cascaded in series, the delay control circuit comprises a shift control register and a selector, and the shift control register controls the number of delay cells through which the signal from the input pin Input passes before the signal reaches an output pin; the selector select one of outputs of the delay cells according to the value of the shift control register and connects the selected output to the output pin Output; and the delay compensation circuit is located before the signal from the input pin Input enters the delay chain or before the signal on the output pin Output is output, and is used to counteract the influence of an introduced delay.

As a further improvement of the circuit of the invention: the number of the delay cells DLL in the delay chain is $2^n-1$, wherein n=1, 2, . . . , and parameters of the delay cells DLL are identical.

As a further improvement of the circuit of the invention: the static calibration circuit comprises:

Calibration counters STA_CAL_CNT1[2n:1] and STA_CAL_CNT2[2n:1], wherein the calibration counter STA_CAL_CNT1 works in a system clock domain, and a work clock of the calibration counter STA_CAL_CNT2 is a signal generated on the output pin Output;

A first comparator for comparing values of the calibration counters STA_CAL_CNT1 and STA_CAL_CNT2 to determine a step size;

A delay control circuit which is the delay control circuit in the pulse edge control circuit; and A delay compensation circuit which is the delay compensation circuit in the pulse edge control circuit.

As a further improvement of the circuit of the invention: the dynamic calibration circuit comprises:

A sample circuit consisting of two stages of registers SAP_REG1[$2^n$-1:1] and SAP_REG2[$2^n$-1:1], wherein each stage of resisters comprises $2^n$-1 sampling registers and is used for recording an output value of each delay cell on the delay chain when a clock edge arrives;

A calibration control circuit used for selecting two groups of continuous values from the registers SAP_REG2 of the sample circuit to form two calibration vectors, and comprising two calibration control registers CAL_CNTL_REG1[n:1] and CAL_CNTL_REG2[n:1], two selectors MUX2 and MUX3, and two calibration vector registers CAL_VEC1[m:1] and CAL_VEC2[m:1], wherein if values of the CAL_CNTL_REG1 and CAL_CNTL_REG2 are $\alpha$ and $\beta$ respectively ($\alpha$, $\beta \leq 2^n-m$), $$CAL\_VEC1[i]=SAP\_REG2[\alpha+i], i=1,2,\ldots,m \quad (2)$$

$$CAL\_VEC2[i]=SAP\_REG2[\beta+i], i=1,2,\ldots,m \quad (3)$$

A second comparator used for calculating a calibration position in each calibration vector to calculate the step size, wherein the calibration position is the position of the last delay cell, through which the signal from the input pin Input is propagated, on the delay chain when the sample circuit samples the output value of each delay cell on the delay chain.

As a further improvement of the circuit of the invention, further comprising a step size register STEP_SIZE_REG[n:1] used for saving step size results calculated by the first comparator and the second comparator, so that the step size results are read by a user program to calculate the value of the shift control register SHIFT_CNTL_REG required for accurately controlling the position of the pulse edge.

As a further improvement of the circuit of the invention, further comprising power consumption control registers PM_CNTL_REG[n:1], wherein PM_CNTL_REG[3:1] is used for turning off clocks of the dynamic calibration circuit and the static calibration circuit and inputs of the delay chain to reduce power consumption of the circuit, and PM_CNTL_REG[n:4] is used for controlling the number of pulse cycles, by which one time of dynamic calibration is performed on the input pin Input to reduce power consumption of the circuit.

The invention further provides a method for generating ultrahigh-precision digital pulse signals using the circuit, accurate step size information is provided for a user program by a static calibration method and a dynamic calibration method to calculate a time offset of an ultrahigh-precision pulse with respect to a pulse signal on an input pin Input to accurately control positions of a rising edge and a falling edge of the pulse signal so as to accurately control the width of pulses; and the time offset calculated by a user program is written into a shift control register SHIFT_CNTL_REG to control the number of delay cells through which the input signal from the input pin Input passes before the input signal reaches an output pin Output.

As a further improvement of the method of the invention, comprising the static calibration method, wherein the steps of the static calibration method comprises:

step S101: connecting the input of a delay chain in a pulse edge control circuit to the output to form an oscillation circuit by the delay chain, and generating a periodic clock signal on the output pin Output;

step S102: setting a value $\Omega$ of a shift control register SHIFT_CNTL_REG in a delay control circuit, and determining a period of a clock signal on the output pin Output;

step S103: setting a static calibration time span $\Phi$, and starting calibration counting, wherein the unit of $\Phi$ is one system clock period; calibration counters STA_CAL_CNT1 and STA_CAL_CNT2 start counting from 0 at the beginning of static calibration and stops counting when a value of STA_CAL_CNT1 is increased to $\Phi$; and step S104: comparing, by a first comparator, values of the comparison counters STA_CAL_CNT1 and STA_CAL_CNT2 to determine a step size, and saving the step size in a step size register STEP_SIZE_REG.

As a further improvement of the method of the invention, comprising the dynamic calibration method, wherein the steps of the dynamic calibration method comprises:

step S201: setting a dynamic calibration position on a rising edge or a falling edge of each pulse on the input pin Input, specifically on the rising edge; then, sampling an output of each delay cell on a delay chain in a pulse edge control circuit on rising edges of $\mu$th and $\lambda$th ($\mu$, $\lambda$=1, 2, 3, . . . ) system clocks, and saving results in SAP_REG2 [2n-1:1]

step S202: performing the following settings according to an initial value of Step_Size in a step size register STEP_SIZE_REG:

$$CAL\_CNTL\_REG1=\alpha=\mu \times Step\_Size-\Delta 1 \quad \Delta 1=1,2,3,\ldots, Step\_Size/2 \quad (6)$$

$$CAL\_CNTL\_REG2=\beta=\lambda \times Step\_Size-\Delta 2 \quad \Delta 2=1,2,3,\ldots, Step\_Size/2 \quad (7)$$

wherein, $\Delta 1$ represents advancing of $\Delta 1$ positions on the delay chain with respect to a propagation position of the rising edge or falling edge of the pulse on the input pin Input on the delay chain after $\mu$ clock periods; $\Delta 2$ represents advancing of $\Delta 2$ positions on the delay chain with respect to the propagation position of the rising edge or falling edge of the pulse on the input pin Input on the delay chain after $\lambda$ clock periods;

step S203: latching values of calibration vectors CAL_VEC1 and CAL_VEC2, and recording the propagation position of the rising edge or the falling edge of the pulse on the input pin Input, so that:

$$CAL\_VEC1[i]=SAP\_REG2[\alpha+i] \alpha \leq 2n-m, i=1,2,\ldots,m \quad (8)$$

$$CAL\_VEC2[i]=SAP\_REG2[\beta+i] \beta \leq 2n-m, i=1,2,\ldots,m \quad (9)$$

step S204: first, setting a calibration completion condition, wherein the calibration completion condition is when bit "0" and bit "1" exit both in CAL_VEC1 and CAL_VEC2, that is:

$$|CAL\_VEC1[m:1]=1 \text{ and } \&CAL\_VEC1[m:1]=0 \quad (10)$$

$$|CAL\_VEC2[m:1]=1 \text{ and } \&CAL\_VEC2[m:1]=0 \quad (11)$$

wherein, if both "1" and "0" exist in CAL_VEC1, it indicates that CAL_VEC1 records the propagation position of the rising edge of the pulse when a rising edge of a $\mu^{th}$ system clock after the rising edge of the pulse arrives, namely the position of a first "0"; if both "1" and "0" exist in CAL_VEC2, it indicates that CAL_VEC2 records the propagation position of the rising edge of the pulse when a rising edge of a $\lambda^{th}$ system clock after the rising edge of the pulse arrives, namely the position of a first "1";

Then, finding out, by a second comparator, the position of the first "0" in CAL_VEC1 in formula (10) and the position of the first "1" in CAL_VEC2 in formula (11), and updating the step size register STEP_SIZE_REG, wherein if the two positions are set as P1 and P2 respectively, $$(\lambda-\mu) \times Step\_Size=P2-P1 \quad (12)$$

$$Step\_Size=int((P2-P1)/(\lambda-\mu)) \quad (13)$$

step S205: if formula (10) and formula (11) in step S204 are not met, changing the values of Δ1 and Δ2, and repeating steps S202-S204 until formula (10) and formula (11) in step S204 are met.

Compared with the prior art, the invention has the following advantages:

1. According to the circuit and method for generating ultrahigh-precision digital pulse signals of the invention, the circuit is simple in structure, high in precision, and suitable for a wide pulse frequency range, and the method is a method for calculating or calibrating the relationship between the work clock period of a system and the delay of delay cells (step size) based on hardware calibration circuits. The hardware calibration circuits comprise a static calibration circuit and a dynamic calibration circuit. According to the circuit, software intervention is not needed, extra delay cells do not need to be added on the basis of the delay chain, and thus, the circuit is easy to use and simple in structure.

2. According to the circuit and method for generating ultrahigh-precision digital pulse signals of the invention, the method is a simple and visual calibration method easy to implement, comprises a static calibration method and a dynamic calibration method, and is able to truly reflect the change of delay precision according to actual working environments and user requirements and feed delay precision data back to a user program to calculate and control the offset of ultrahigh-precision pulses so as to accurately control the width of the pulses.

DETAILED DESCRIPTION OF THE INVENTION

The invention will be described in further detail below in conjunction with the accompanying drawings and specific embodiments of the invention.

Figure 2:
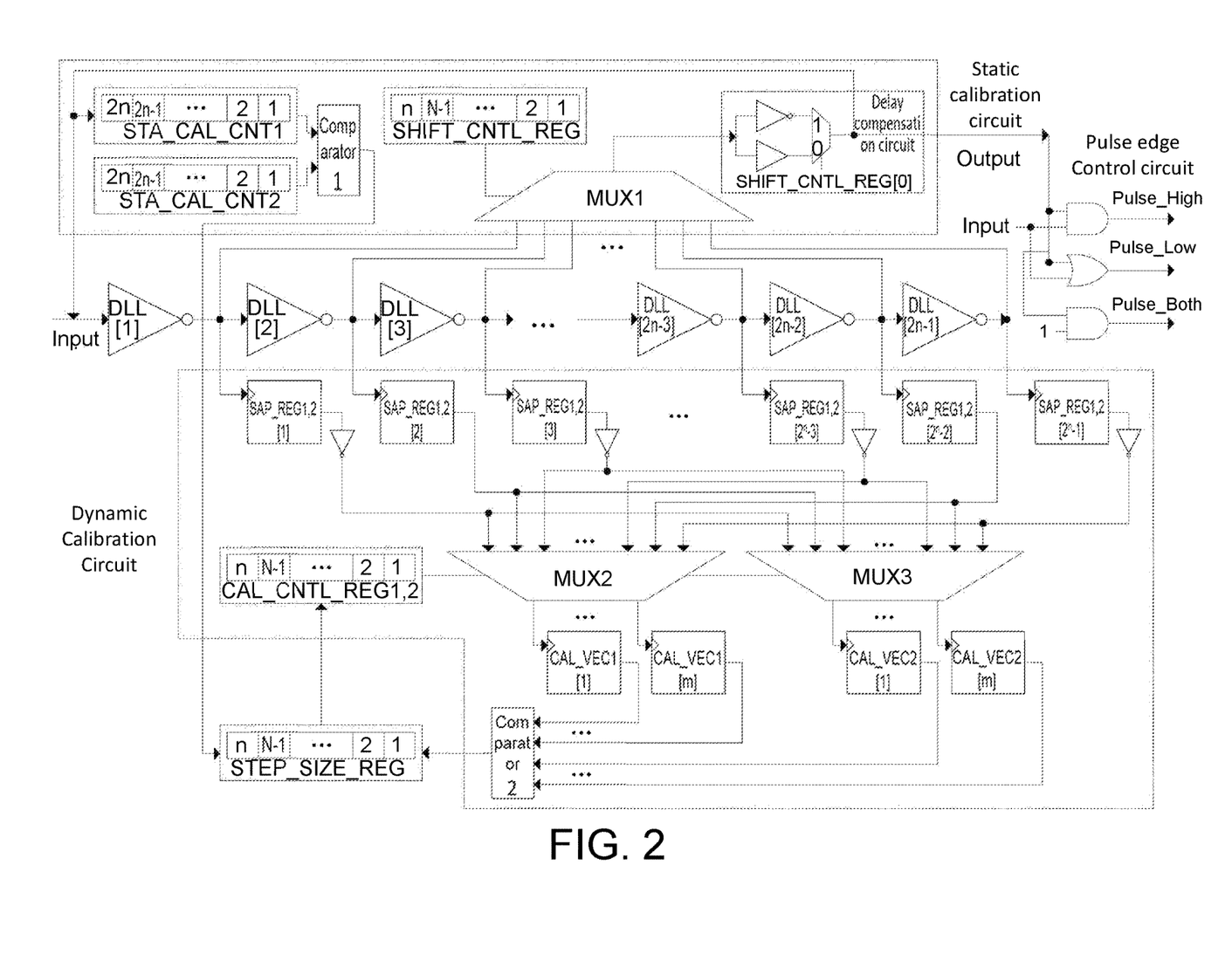
FIG. 2 is a structural principle diagram of a circuit of the invention.

As shown in FIG. 2, the invention provides a circuit for generating ultrahigh-precision digital pulse signals, comprising:

A pulse edge control circuit used for delaying a signal on an input pin Input (such as a traditional PWM output signal) to some extent and accurately controlling the positions of a rising edge and a falling edge of the pulse signal to accurately control the width of pulses and generate ultrahigh-precision pulses;

A static calibration circuit used for calculating step size information representing the relationship between a work clock period of a system and a delay of delay cells, namely the number of delay cells, through which the signal is propagated and passes within one system clock period, when the system is powered on to work, and storing the step size information in a step size register STEP_SIZE_REG; and A dynamic calibration circuit used for dynamically calculating step size information in real time when a rising edge or a falling edge of each pulse on the input pin Input arrives.

In a specific application example, the pulse edge control circuit comprises a delay chain, a delay control circuit, and a delay compensation circuit, wherein:

The delay chain consists of a series of delay cells (DLL) cascaded in series, and has a length of $2^n-1$ (n=1, 2, . . . ). Parameters of the delay cells are identical, and the delay δ of each delay cell (the time for the signal to pass through the delay cell) varies with factors such as the working voltage, temperature, and integrated circuit fabrication process of the circuit. A signal input to the delay chain is from the input pin Input and is output to an output pin Output. When the circuit works in a static calibration mode, the signal on the input pin Input is from the output pin Output.

The delay control circuit comprises a shift control register SHIFT_CNTL_REG[n:1] and a selector MUX1. The shift control register controls the number of delay cells, through which the signal from the input pin Input passes, before the signal reaches the output pin. Under normal circumstances, the shift control register is input by a user program; and in the static calibration mode, the shift control register is set by the static calibration circuit. The selector MUX1 selects one of outputs of the $2^n-1$ delay cells according to the value of SHIFT_CNTL_REG and connects the selected output to the output pin Output.

Considering that other delays (such as a delay produced by the selector MUX1) are introduced to the signal on the path from the input pin Input to the output pin Output, the delay compensation circuit may be added before the signal from the input pin Input enters the delay chain or before the signal on the output pin Output is output, to counteract the influence of the introduced delays.

In a specific application example, the static calibration circuit comprises:

Calibration counters STA_CAL_CNT1[2n:1] and STA_CAL_CNT2[2n:1], wherein the calibration counter STA_CAL_CNT1[2n:1] works in a system clock domain, and a work clock of the calibration counter STA_CAL_CNT2 is a signal generated on the output pin Output;

A first comparator for comparing values of the calibration counters STA_CAL_CNT1 and STA_CAL_CNT2 to determine a step size;

A delay control circuit, which is the delay control circuit in the pulse edge control circuit; and A delay compensation circuit, which is the delay compensation circuit in the pulse edge control circuit.

In a specific application example, the dynamic calibration circuit comprises:

A sample circuit consisting of two stages of registers SAP_REG1[$2^n-1$:1] and SAP_REG2[$2^n-1$:1], wherein each stage of resisters comprises $2^n-1$ sampling registers and is used for recording an output value of each delay cell on the delay chain when a clock edge arrives; because each delay cell is an inverter, outputs of two successive delay cells are opposite in a stable state, and for the sake of convenient calculation, outputs of the sampling registers SAP_REG2 [2i+1](i=0, 1, 2, . . . ) each drive one inverter, and in the invention, odd outputs of the sampling registers SAP_REG2 are the outputs of the inverters;

A calibration control circuit used for selecting two groups of continuous values from the registers SAP_REG2 of the sample circuit to form two calibration vectors, and comprising two calibration control registers CAL_CNTL_REG1[n:1] and CAL_CNTL_REG2[n:1], two selectors MUX2 and MUX3, and two calibration vector registers CAL_VEC1[m:1] and CAL_VEC2[m:1], wherein if values of the CAL_CNTL_REG1 and CAL_CNTL_REG2 are $\alpha$ and $\beta$ respectively ($\alpha$, $\beta \leq 2^n-m$), $$CAL\_VEC1[i]=SAP\_REG2[\alpha+i], i=1,2,\ldots,m \quad (2)$$

$$CAL\_VEC2[i]=SAP\_REG2[\beta+i], i=1,2,\ldots,m \quad (3)$$

A second comparator used for calculating a calibration position in each calibration vector according to a rule to calculate the step size, wherein the calibration position is the position of the last delay cell, through which the signal from the input pin Input is propagated, on the delay chain when the sample circuit samples the output value of each delay cell on the delay chain.

The invention further comprises:

A step size register STEP_SIZE_REG[n:1] used for saving step size results calculated by the comparators, so that the step size results can be read by the user program to calculate the value of the shift control register SHIFT_CNTL_REG required for accurately controlling the position of the pulse edge; and Power consumption control registers PM_CNTL_REG[n: 1], wherein PM_CNTL_REG[3:1] is used for turning off clocks of the dynamic calibration circuit and the static calibration circuit and inputs of the delay chain to reduce power consumption of the circuit, and PM_CNTL_REG[n: 4] is used for controlling the number of pulse cycles, by which one time of dynamic calibration is performed on the input pin Input to reduce power consumption of the circuit.

The circuit of the invention has three working modes:

In a normal working mode, the user program calculates a time offset of an ultrahigh-precision pulse with respect to the pulse signal on the input pin Input according to the Step_Size information, and accurately controls the width of the pulse signal by changing the value of SHIFT_CNTL_REG to generate the ultrahigh-precision pulse.

In a static calibration mode contrary to the normal working mode, an initial step size is calculated when the system is powered on to work, and is stored in the step size register STEP_SIZE_REG In a dynamic calibration mode, the value of the step size Step_Size is dynamically calculated in the normal working mode to eliminate the influences of factors, such as the working voltage, temperature, and integrated circuit fabrication process of the circuit, on pulse precision.

The invention further provides a method for generating ultrahigh-precision digital pulse signals, which calculates or calibrates the step size in real time based on the above circuit structure, generates digital pulses with the precision higher than the system clock period, and comprises a static calibration method and a dynamic calibration method. That is to say, the method of the invention dynamically calculates or calibrates the step size in real time by the static method and the dynamic method based on the pulse edge control circuit, the static calibration circuit and the dynamic calibration circuit to generate digital pulses with the precision higher than the system clock period. The Step_Size information is stored in the step size register STEP_SIZE_REG to be read by the user program to calculate the value of the shift control register SHIFT_CNTL_REG required for accurately controlling the pulse width.

Users can accurately control the delay time of the rising edge or falling edge of the signal from the input pin Input only by changing and controlling the offset of the ultrahigh-precision pulse (the value of the shift control register SHIFT_CNTL_REG) according to the value of the step size register STEP_SIZE_REG, so as to accurately control the pulse width. The SHIFT_CNTL_REG controls the number of delay cells, through which the input signal passes, before the input signal reaches the output pin.

Suppose the delay of the delay cells is $\delta=150$ ps and SHIFT_CNTL_REG=44, the delay time of the rising edge or falling edge of the signal from the input pin Input is t=44×$\delta$=6600 ps.

Figure 3:
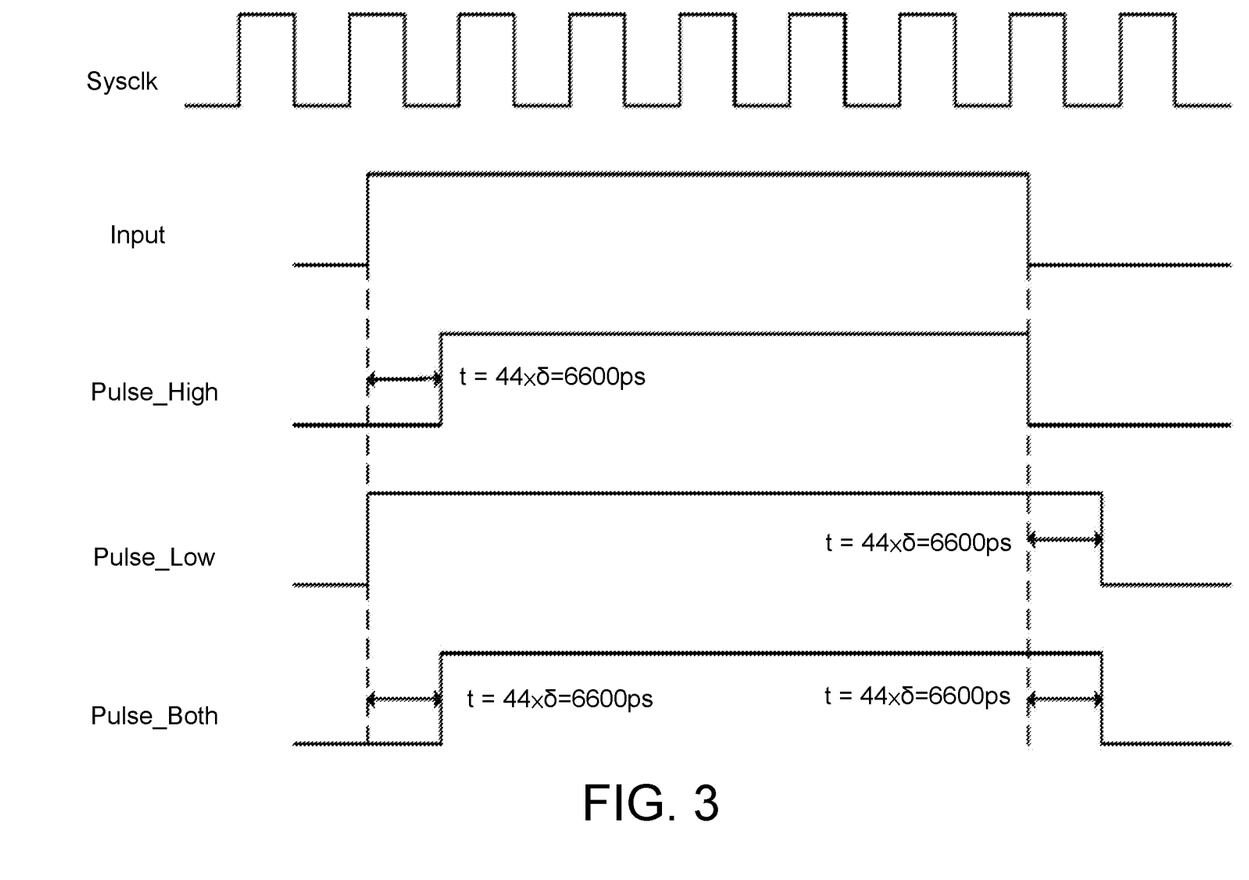
FIG. 3 is a schematic diagram of high-precision pulse generation according to a method of the invention.
Figure 4:
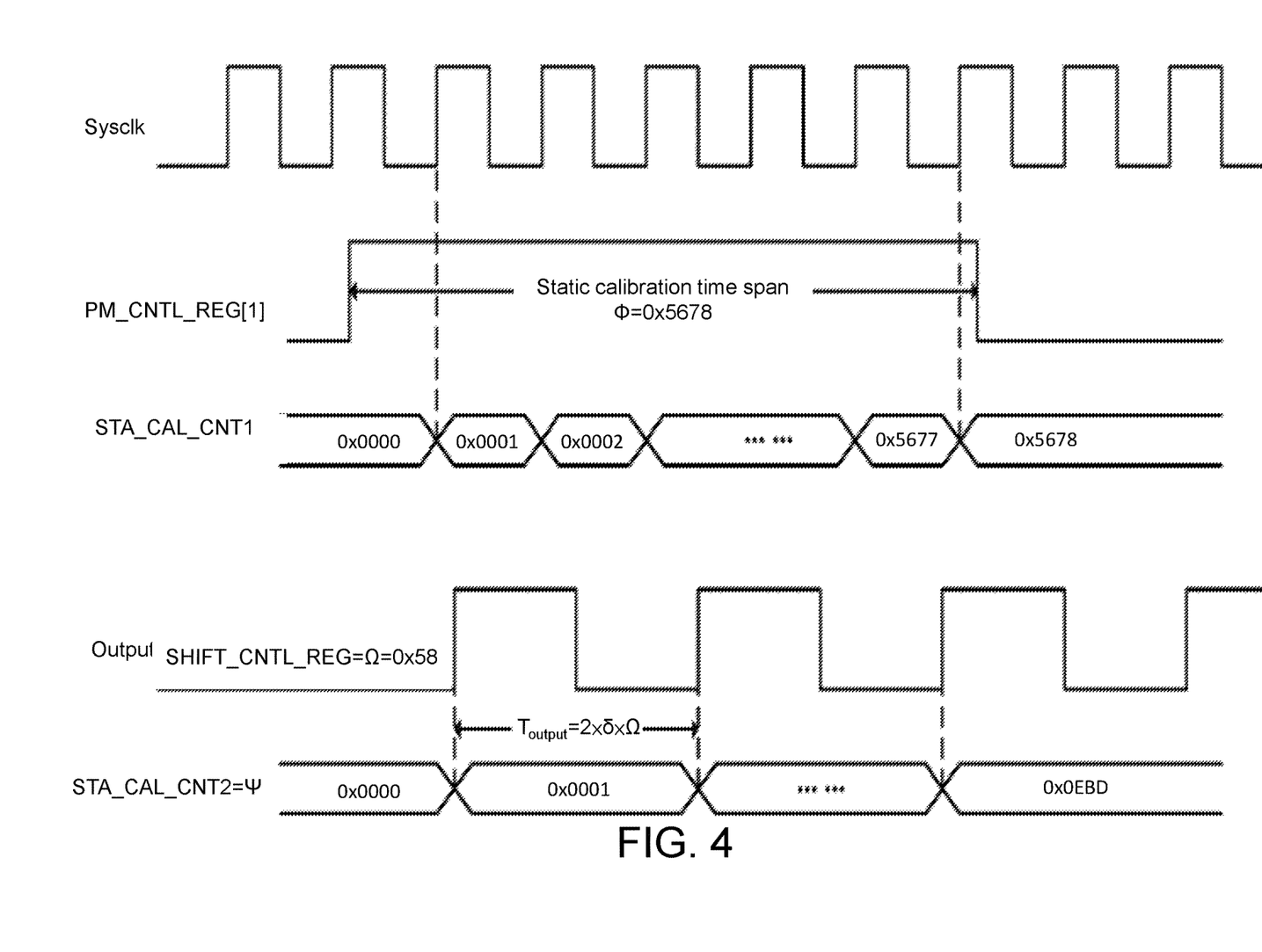
FIG. 4 is a schematic diagram of a static calibration method according to the method of the invention.

FIG. 3 is a schematic diagram of high-precision pulse generation. The ultrahigh-precision pulse finally generated may be in the following three cases:

Case 1: ultrahigh-precision control is performed only on the rising edge of the pulse Pulse_High=Input && Output;

Case 2: ultrahigh-precision control is performed only on the falling edge of the pulse Pulse_Low=Input||Output;

Case 3: ultrahigh-precision control is performed both on the rising edge and the falling edge of the pulse Pulse_Both=Output;

In a specific application example, the aim of static calibration is to calculate the Step Size when the system is powered on to work. As shown by FIG. 4 which is a schematic diagram of the static calibration method, the static calibration method comprises four steps:

step S101: the input of a delay chain in a pulse edge control circuit is connected to the output to form an oscillation circuit by the delay chain, and a periodic clock signal is generated on an output pin Output.

step S102: the value $\Omega$, of a shift control register SHIFT_CNTL_REG in a delay control circuit is set, and the period of a clock signal on the output pin Output is determined.

step S103: a static calibration time span (to (unit: one system clock period) is set, and calibration counting is started, wherein calibration counters STA_CAL_CNT1 and STA_CAL_CNT2 start counting from 0 at the beginning of static calibration and stop counting when the value of STA_CAL_CNT1 is increased to Φ.

step S104: a first comparator compares the values of the comparison counters STA_CAL_CNT1 and STA_CAL_CNT2 to determine a step size, and the step size is saved in a step size register STEP_SIZE_REG.

In one specific application example, the work clock period of the system is Tsys=4.5 ns, the delay of the delay cells is δ=150 ps, the value of the shift control register is SHIFT_CNTL_REG=Ω=0x58, and the static calibration time span is Φ=0x5678, so when STA_CAL_CNT1=Φ, the counter STA_CAL_CNT2=Ψ=0x0EBD.

$$T_{sys} \times \Phi = 2 \times \delta \times \Omega \times \Psi \quad (4)$$

$$\text{Step\_Size} = \text{int}(T_{sys}/\delta) = \text{int}(2 \times \Omega \times \Psi/\Phi) = 30 \quad (5)$$

Figure 5:
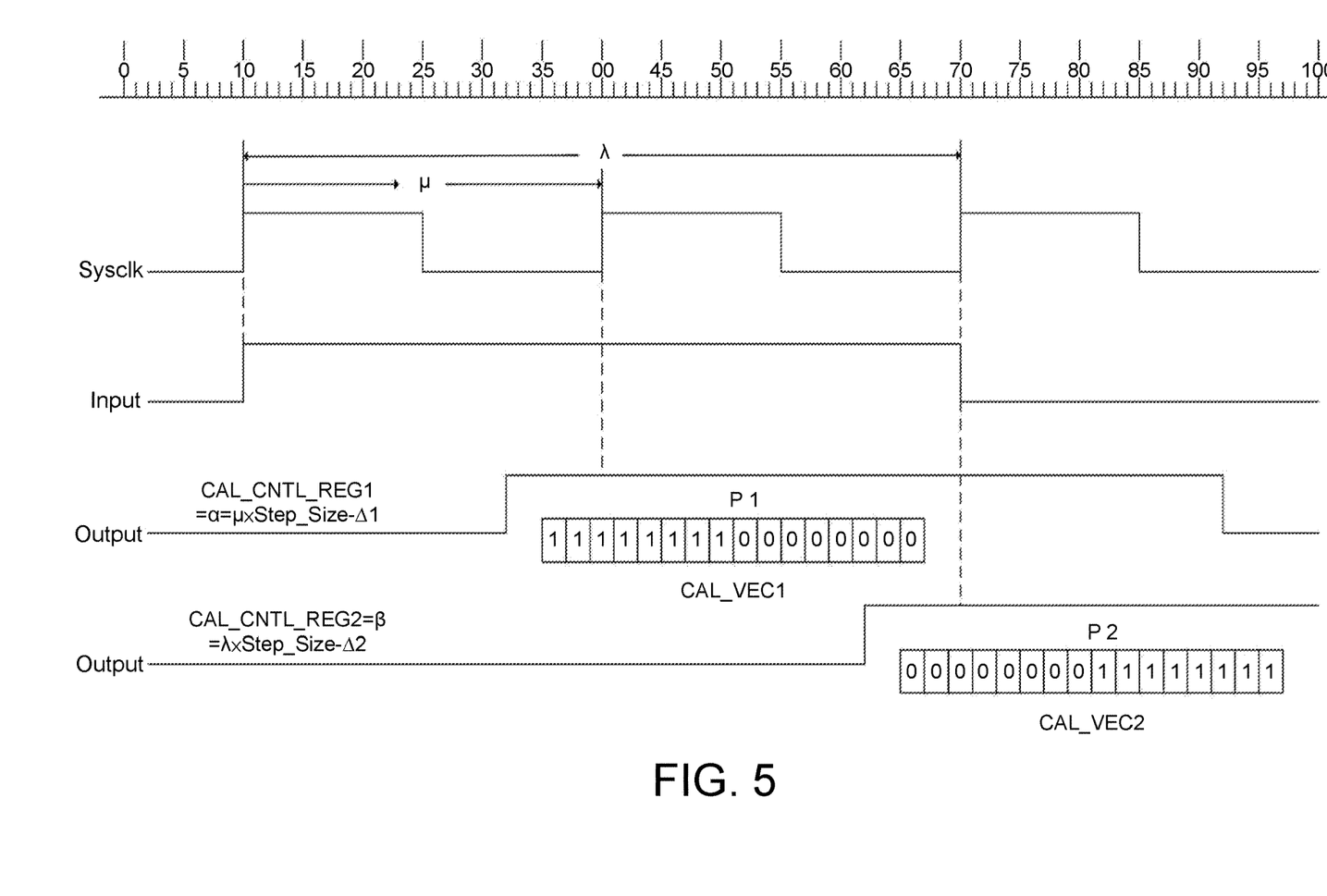
FIG. 5 is a schematic diagram of a dynamic calibration method according to the method of the invention.

In one specific application example, the aim of dynamic calibration is to dynamically find out the propagation position of the pulse edge in real time when the rising edge or falling edge of each pulse on the input pin Input arrives, and dynamically calculate the step size Step_Size. As shown in FIG. 5 which is a schematic diagram of the dynamic calibration method, the dynamic calibration method comprises five steps:

step S201: a dynamic calibration position is set on a rising edge or a falling edge of each pulse on the input pin Input, specifically on the rising edge; then, an output of each delay cell on a delay chain in the pulse edge control circuit is sampled on rising edges of the μth and λth (μ, λ=1, 2, 3, . . . ) system clocks, and results are saved in SAP_REG2 $[2^n-1:1]$.

step S202: the following settings are performed according to an initial value of Step_Size in the step size register STEP_SIZE_REG:

$$\text{CAL\_CNTL\_REG1} = \alpha = \mu \times \text{Step\_Size} - \Delta 1 \quad \Delta 1 = 1,2,3,\ldots,\text{Step\_Size}/2 \quad (6)$$

$$\text{CAL\_CNTL\_REG2} = \beta = \lambda \times \text{Step\_Size} - \Delta 2 \quad \Delta 2 = 1,2,3,\ldots,\text{Step\_Size}/2 \quad (7)$$

Wherein, Δ1 represents advancing Δ1 positions on the delay chain with respect to the propagation position of the rising edge or falling edge of the pulse on the input pin Input on the delay chain after μ clock periods; Δ2 represents advancing Δ2 positions on the delay chain with respect to the propagation position of the rising edge or falling edge of the pulse on the input pin Input on the delay chain after λ clock periods;

step S203: values of calibration vectors CAL_VEC1 and CAL_VEC2 are latched, and the propagation position of the rising edge or the falling edge of the pulse on the input pin Input is recorded, so that:

$$\text{CAL\_VEC1}[i] = \text{SAP\_REG2}[\alpha+i] \alpha \leq 2n-m, i=1,2,\ldots,m \quad (8)$$

$$\text{CAL\_VEC2}[i] = \text{SAP\_REG2}[\beta+i] \beta \leq 2n-m, i=1,2,\ldots,m \quad (9)$$

step S204: first, a calibration completion condition is set, wherein the calibration completion condition is when bit "0" and bit "1" exit both in CAL_VEC1 and CAL_VEC2, that is:

$$|\text{CAL\_VEC1}[m:1]=1 \text{ and } \&\text{CAL\_VEC1}[m:1]=0 \quad (10)$$

$$|\text{CAL\_VEC2}[m:1]=1 \text{ and } \&\text{CAL\_VEC2}[m:1]=0 \quad (11)$$

Formula (10) represents that a result obtained by performing a bitwise OR operation on m bits of data in CAL_VEC1[m:1] is 1 and a result obtained by performing a bitwise AND operation on the m bits of data is 0; Formula (11) represents that a result obtained by performing a bitwise OR operation on m bits of data in CAL_VEC2[m:1] is 1, and a result obtained by performing a bitwise AND operation on the m bits of data in CAL_VEC2[m:1] is 0.

Wherein, if both "1" and "0" exist in CAL_VEC1, it indicates that CAL_VEC1 records the propagation position of the rising edge of the pulse (the position of a first "0") when a rising edge of a $\mu^{th}$ system clock after the rising edge of the pulse arrives; if both "1" and "0" exist in CAL_VEC2, it indicates that CAL_VEC2 records the propagation position of the rising edge of the pulse (the position of a first "1") when a rising edge of a $\lambda^{th}$ system clock after the rising edge of the pulse arrives.

Then, a second comparator finds out the position of the first "0" in CAL_VEC1 in formula (10) and the position of the first "1" in CAL_VEC2 in formula (11), and the step size register STEP_SIZE_REG is updated. If the two positions are set as P1 and P2 respectively, $$(\lambda-\mu) \times \text{Step\_Size} = P2-P1 \quad (12)$$

$$\text{Step\_Size} = \text{int}((P2-P1)/(\lambda-\mu)) \quad (13)$$

step S205: if formula (10) and formula (11) in step S204 are not met (for example, all values in the calibration vector CAL_VEC1 are "1", or all values in the calibration vector CAL_VEC2 are "0"), the values of Δ1 and Δ2 are changed (for example, 1 is subtracted from the value of Δ1), and steps S202-S204 are repeated until formula (10) and formula (11) in step S204 are met.

The basic working process of the method and circuit of the invention is as follows:

Static calibration is started, and an initial step size Step_Size is calculated when a system is powered on to work;

The normal working mode is enabled; the user program is started to perform high-precision pulse wide control; and the user program delays a signal on the input pin Input (such as an output signal from a traditional PWM circuit) to some extent and accurately controls the positions of the rising edge and the falling edge of the pulse signal by changing the value of the shift control register SHIFT_CNTL_REG, such that the width of pulses is accurately controlled and ultra-high-precision pulses are generated.

Dynamic calibration is started; if the factors such as the fluctuations of the working temperature and voltage or the fabrication process have a great influence on the delay δ of the delay cells, that is, the factors have a great influence on the time precision of pulses, the dynamic calibration mode may be enabled in the normal working mode to accurately control the pulse width in real time.

The above embodiments merely illustrate preferred implementations of the invention, and are not intended to limit the protection scope of the invention. All technical solutions based on the concept of the invention should also fall within the protection scope of the invention. It should be noted that various improvements and embellishments made by those ordinarily skilled in the art without departing from the principle of the invention should also fall within the protection scope of the invention.

What is claimed is:

1. A circuit for generating ultrahigh-precision digital pulse signals, comprising:
    a pulse edge control circuit, used for delaying a signal on an input pin Input, controlling positions of a rising edge and a falling edge of a pulse signal, controlling the width of pulses, and generating ultrahigh-precision pulses; the pulse edge control circuit comprising a delay chain, a delay control circuit and a delay compensation circuit; the delay control circuit comprising a shift control register and a selector, and the shift control register controlling a number of delay cells through which the signal from the input pin Input passes before the signal reaches an output pin; and the delay compensation circuit being used to counteract the influence of an introduced delay;
    a static calibration circuit, used for calculating step size information representing the relationship between a work clock period of a system and a delay of delay cells in the pulse edge control circuit when the system is powered on to work, and storing the step size information;
    the static calibration circuit comprising:
    a calibration counter;
    a first comparator, for comparing values of the calibration counter to determine a step size;
    a delay control circuit, which is the delay control circuit in the pulse edge control circuit; and
    a delay compensation circuit, which is the delay compensation circuit in the pulse edge control circuit;
    a dynamic calibration circuit, used for dynamically and real-time calculating the step size information when a rising edge or a falling edge of each pulse on the input pin Input arrives;
    the dynamic calibration circuit comprising:
    a sample circuit, used for recording an output value of each delay cell on the delay chain when a clock edge arrives;
    a calibration control circuit, used for selecting two groups of continuous values from the sample circuit to form two calibration vectors; and
    a second comparator, used for calculating a calibration position in each calibration vector to calculate the step size, wherein the calibration position is the position of the last delay cell, through which the signal from the input pin Input is propagated, on the delay chain when the sample circuit samples the output value of each delay cell on the delay chain.

2. The circuit for generating ultrahigh-precision digital pulse signals according to claim 1, wherein the delay chain consists of a series of delay cells DLL cascaded in series; the selector selects one of outputs of delay cells according to a value of the shift control register and connects the selected output to an output pin Output; and the delay compensation circuit is located before the signal from the input pin Input enters the delay chain or before the signal on the output pin Output is output.

3. The circuit for generating ultrahigh-precision digital pulse signals according to claim 2, wherein the delay chain has a length of $2^n-1$, so that the delay chain comprises $2^n-1$ delay cells DLL, wherein n=1, 2, . . . ; and parameters of each delay cell DLL are identical.

4. The circuit for generating ultrahigh-precision digital pulse signals according to claim 3, wherein the calibration counter comprises two calibration counters STA_CAL_CNT1[2n:1] and STA_CAL_CNT2[2n:1], the calibration counter STA_CAL_CNT1 works in a system clock domain, and a work clock of the calibration counter STA_CAL_CNT2 is a signal generated on the output pin Output;
    the first comparator is used for comparing values of the calibration counters STA_CAL_CNT1 and STA_CAL_CNT2 to determine the step size.

5. The circuit for generating ultrahigh-precision digital pulse signals according to claim 3, wherein the sample circuit consists of two stages of registers SAP_REG1[$2^n-1$:1] and SAP_REG2[$2^n-1$:1], each stage of resisters comprises $2^n-1$ sampling registers and is used for recording the output value of each delay cell on the delay chain when a clock edge arrives
    the calibration control circuit is used for selecting two groups of continuous values from the registers SAP_REG2 of the sample circuit to form two calibration vectors, and comprises two calibration control registers CAL_CNTL_REG1[n:1] and CAL_CNTL_REG2[n:1], two selectors MUX2 and MUX3, and two calibration vector registers CAL_VEC1[m:1] and CAL_VEC2[m:1], wherein if values of the CAL_CNTL_REG1 and CAL_CNTL_REG2 are α and β respectively, and α, β≤$2^n$−m, $$CAL\_VEC1[i]=SAP\_REG2[\alpha+i], i=1,2,\ldots,m \quad (2)$$

$$CAL\_VEC2[i]=SAP\_REG2[\beta+i], i=1,2,\ldots,m \quad (3).$$

6. The circuit for generating ultrahigh-precision digital pulse signals according to claim 3, further comprising a step size register STEP_SIZE_REG[n:1] used for saving step size results calculated by the first comparator and the second comparator, so that the step size results are read by a user program, to calculate the value of a shift control register SHIFT_CNTL_REG required for accurately controlling the position of a pulse edge.

7. The circuit for generating ultrahigh-precision digital pulse signals according to claim 3, further comprising power consumption control registers PM_CNTL_REG[n:1], wherein PM_CNTL_REG[3:1] is used for turning off clocks of the dynamic calibration circuit and the static calibration circuit and inputs of the delay chain, to reduce power consumption of the circuit, and PM_CNTL_REG[n:4] is used for controlling the number of pulse cycles, by which one time of dynamic calibration is performed on the input pin Input, to reduce power consumption of the circuit.

8. A method for generating ultrahigh-precision digital pulse signals using the circuit according to claim 3, wherein accurate step size information is provided for a user program by a static calibration method and a dynamic calibration method, to calculate a time offset of an ultrahigh-precision pulse with respect to a pulse signal on an input pin Input to accurately control positions of a rising edge and a falling edge of the pulse signal so as to accurately control the width of pulses; and the time offset calculated by the user program is written into a shift control register SHIFT_CNTL_REG to control the number of delay cells through which an input signal from the input pin Input passes before the input signal reaches an output pin Output.

9. The circuit for generating ultrahigh-precision digital pulse signals according to claim 2, wherein the calibration counter comprises two calibration counters STA_CAL_CNT1[2n:1] and STA_CAL_CNT2[2n:1], the calibration counter STA_CAL_CNT1 works in a system clock domain, and a work clock of the calibration counter STA_CAL_CNT2 is a signal generated on the output pin Output;

the first comparator is used for comparing values of the calibration counters STA_CAL_CNT1 and STA_CAL_CNT2 to determine the step size.

10. The circuit for generating ultrahigh-precision digital pulse signals according to claim 2, wherein the sample circuit consists of two stages of registers SAP_REG1[$2^n-1$:1] and SAP_REG2[$2^n-1$:1], each stage of resisters comprises $2^n-1$ sampling registers and is used for recording the output value of each delay cell on the delay chain when a clock edge arrives the calibration control circuit is used for selecting two groups of continuous values from the registers SAP_REG2 of the sample circuit to form two calibration vectors, and comprises two calibration control registers CAL_CNTL_REG1[n:1] and CAL_CNTL_REG2[n:1], two selectors MUX2 and MUX3, and two calibration vector registers CAL_VEC1[m:1] and CAL_VEC2[m:1], wherein if values of the CAL_CNTL_REG1 and CAL_CNTL_REG2 are $\alpha$ and $\beta$ respectively, and $\alpha$, $\beta \leq 2^n - m$, $$\text{CAL\_VEC1}[i] = \text{SAP\_REG2}[\alpha+i], i=1,2,\ldots,m \quad (2)$$

$$\text{CAL\_VEC2}[i] = \text{SAP\_REG2}[\beta+i], i=1,2,\ldots,m \quad (3).$$

11. The circuit for generating ultrahigh-precision digital pulse signals according to claim 2, further comprising a step size register STEP_SIZE_REG[n:1] used for saving step size results calculated by the first comparator and the second comparator, so that the step size results are read by a user program, to calculate the value of a shift control register SHIFT_CNTL_REG required for accurately controlling the position of a pulse edge.

12. The circuit for generating ultrahigh-precision digital pulse signals according to claim 2, further comprising power consumption control registers PM_CNTL_REG[n:1], wherein PM_CNTL_REG[3:1] is used for turning off clocks of the dynamic calibration circuit and the static calibration circuit and inputs of the delay chain, to reduce power consumption of the circuit, and PM_CNTL_REG[n:4] is used for controlling the number of pulse cycles, by which one time of dynamic calibration is performed on the input pin Input, to reduce power consumption of the circuit.

13. A method for generating ultrahigh-precision digital pulse signals using the circuit according to claim 2, wherein accurate step size information is provided for a user program by a static calibration method and a dynamic calibration method, to calculate a time offset of an ultrahigh-precision pulse with respect to a pulse signal on an input pin Input to accurately control positions of a rising edge and a falling edge of the pulse signal so as to accurately control the width of pulses; and the time offset calculated by the user program is written into a shift control register SHIFT_CNTL_REG to control the number of delay cells through which an input signal from the input pin Input passes before the input signal reaches an output pin Output.

14. The circuit for generating ultrahigh-precision digital pulse signals according to claim 1, wherein the calibration counter comprises two calibration counters STA_CAL_CNT1[2n:1] and STA_CAL_CNT2[2n:1], the calibration counter STA_CAL_CNT1 works in a system clock domain, and a work clock of the calibration counter STA_CAL_CNT2 is a signal generated on an output pin Output;

the first comparator is used for comparing values of the calibration counters STA_CAL_CNT1 and STA_CAL_CNT2 to determine the step size.

15. The circuit for generating ultrahigh-precision digital pulse signals according to claim 1, wherein the sample circuit consists of two stages of registers SAP_REG1[$2^n-1$:1] and SAP_REG2[$2^n-1$:1], each stage of resisters comprises $2^n-1$ sampling registers and is used for recording the output value of each delay cell on the delay chain when a clock edge arrives the calibration control circuit is used for selecting two groups of continuous values from the registers SAP_REG2 of the sample circuit to form two calibration vectors, and comprises two calibration control registers CAL_CNTL_REG1[n:1] and CAL_CNTL_REG2[n:1], two selectors MUX2 and MUX3, and two calibration vector registers CAL_VEC1[m:1] and CAL_VEC2[m:1], wherein if values of the CAL_CNTL_REG1 and CAL_CNTL_REG2 are $\alpha$ and $\beta$ respectively, and $\alpha$, $\beta \leq 2^n - m$, $$\text{CAL\_VEC1}[i] = \text{SAP\_REG2}[\alpha+i], i=1,2,\ldots,m \quad (2)$$

$$\text{CAL\_VEC2}[i] = \text{SAP\_REG2}[\beta+i], i=1,2,\ldots,m \quad (3).$$

16. The circuit for generating ultrahigh-precision digital pulse signals according to claim 1, further comprising a step size register STEP_SIZE_REG[n:1] used for saving step size results calculated by the first comparator and the second comparator, so that the step size results are read by a user program, to calculate the value of a shift control register SHIFT_CNTL_REG required for accurately controlling the position of a pulse edge.

17. The circuit for generating ultrahigh-precision digital pulse signals according to claim 1, further comprising power consumption control registers PM_CNTL_REG[n:1], wherein PM_CNTL_REG[3:1] is used for turning off clocks of the dynamic calibration circuit and the static calibration circuit and inputs of the delay chain, to reduce power consumption of the circuit, and PM_CNTL_REG[n:4] is used for controlling the number of pulse cycles, by which one time of dynamic calibration is performed on the input pin Input, to reduce power consumption of the circuit.

18. A method for generating ultrahigh-precision digital pulse signals using the circuit according to claim 1, wherein accurate step size information is provided for a user program by a static calibration method and a dynamic calibration method, to calculate a time offset of an ultrahigh-precision pulse with respect to a pulse signal on an input pin Input to accurately control positions of a rising edge and a falling edge of the pulse signal so as to accurately control the width of pulses; and the time offset calculated by the user program is written into a shift control register SHIFT_CNTL_REG to control the number of delay cells through which an input signal from the input pin Input passes before the input signal reaches an output pin Output.

19. The method for generating ultrahigh-precision digital pulse signals according to claim 18, comprising the static calibration method, wherein the steps of the static calibration method comprises:

step S101: connecting the input of a delay chain in a pulse edge control circuit to an output to form an oscillation circuit by the delay chain, and generating a periodic clock signal on the output pin Output;

step S102: setting a value $\Omega$ of the shift control register SHIFT_CNTL_REG in a delay control circuit, and determining a period of a clock signal on the output pin Output;

step S103: setting a static calibration time span Φ, and starting calibration counting, wherein the unit of Φ is one system clock period; a calibration counter STA_CAL_CNT1 and a calibration counter STA_CAL_CNT2 start counting from 0 at the beginning of static calibration and stop counting when a value of STA_CAL_CNT1 is increased to 1; and step S104: comparing, by a first comparator, values of a comparison counter STA_CAL_CNT1 and a comparison counter STA_CAL_CNT2 to determine a step size, and saving the step size in a step size register STEP_SIZE_REG.

20. The method for generating ultrahigh-precision digital pulse signals according to claim 18, comprising the dynamic calibration method, wherein the steps of the dynamic calibration method comprises:

step S201: setting a dynamic calibration position on a rising edge or a falling edge of each pulse on the input pin Input, specifically on the rising edge; then, sampling an output of each delay cell on a delay chain in a pulse edge control circuit on rising edges of $\mu^{th}$ and $\lambda^{th}$ ($\mu, \lambda = 1, 2, 3, \ldots$) system clocks, and saving results in SAP_REG2[2n−1:1], wherein the calibration control circuit is used for selecting two groups of continuous values from the registers SAP_REG2 of the sample circuit to form two calibration vectors, and comprises two calibration control registers CAL_CNTL_REG1[n:1] and CAL_CNTL_REG2[n:1], two selectors MUX2 and MUX3, and two calibration vector registers CAL_VEC1[m:1] and CAL_VEC2[m:1], wherein if values of the CAL_CNTL_REG1 and CAL_CNTL_REG2 are α and β respectively, and α, β≤$2^n$−m, step S202: performing the following settings according to an initial value of Step_Size in a step size register STEP_SIZE_REG:

$$\text{CAL\_CNTL\_REG1}=\alpha=\mu\times\text{Step\_Size}-\Delta 1 \quad \Delta 1=1,2,3,\ldots,\text{Step\_Size}/2 \quad (6)$$

$$\text{CAL\_CNTL\_REG2}=\beta=\lambda\times\text{Step\_Size}-\Delta 2 \quad \Delta 2=1,2,3,\ldots,\text{Step\_Size}/2 \quad (7)$$

wherein, Δ1 represents advancing of Δ1 positions on the delay chain with respect to a propagation position of the rising edge or falling edge of the pulse on the input pin Input on the delay chain after μ clock periods; Δ2 represents advancing of Δ2 positions on the delay chain with respect to the propagation position of the rising edge or falling edge of the pulse on the input pin Input on the delay chain after λ clock periods;

step S203: latching values of calibration vectors CAL_VEC1 and CAL_VEC2 to α and β, and recording the propagation position of the rising edge or the falling edge of the pulse on the input pin Input, so that:

$$\text{CAL\_VEC1}[i]=\text{SAP\_REG2}[\alpha+i]\alpha\leq 2n-m, i=1,2,\ldots,m \quad (8)$$

$$\text{CAL\_VEC2}[i]=\text{SAP\_REG2}[\beta+i]\beta\leq 2n-m, i=1,2,\ldots,m \quad (9)$$

step S204: first, setting a calibration completion condition, wherein the calibration completion condition is when bit "0" and bit "1" exit both in CAL_VEC1 and CAL_VEC2, that is:

$$|\text{CAL\_VEC1}[m:1]=1 \text{ and } \&\text{CAL\_VEC1}[m:1]=0 \quad (10)$$

$$|\text{CAL\_VEC2}[m:1]=1 \text{ and } \&\text{CAL\_VEC2}[m:1]=0 \quad (11)$$

wherein, if both "1" and "0" exist in CAL_VEC1, it indicates that CAL_VEC1 records the propagation position of the rising edge of the pulse when a rising edge of a $\mu^{th}$ system clock after the rising edge of the pulse arrives, namely the position of a first "0"; if both "1" and "0" exist in CAL_VEC2, it indicates that CAL_VEC2 records the propagation position of the rising edge of the pulse when a rising edge of a $\lambda^{th}$ system clock after the rising edge of the pulse arrives, namely the position of a first "1";

Then, finding out, by a second comparator, the position of the first "0" in CAL_VEC1 in formula (10) and the position of the first "1" in CAL_VEC2 in formula (11), and updating the step size register STEP_SIZE_REG, wherein if the two positions are set as P1 and P2 respectively, $$(\lambda-\mu)\times\text{Step\_Size}=P2-P1 \quad (12)$$

$$\text{Step\_Size}=\text{int}((P2-P1)/(\lambda-\mu)) \quad (13)$$

step S205: if formula (10) and formula (11) in step S204 are not met, changing the values of Δ1 and Δ2, and repeating steps S202-S204 until formula (10) and formula (11) in step S204 are met.

* * * * *